United States Patent
Park et al.

(10) Patent No.: US 7,595,143 B2
(45) Date of Patent: Sep. 29, 2009

(54) PHOTORESIST COMPOSITION AND METHOD OF MANUFACTURING A THIN-FILM TRANSISTOR SUBSTRATE USING THE SAME

(75) Inventors: Jeong-Min Park, Seoul (KR); Hi-Kuk Lee, Yongin-si (KR); Hyoc-Min Youn, Seoul (KR); Ki-Hyuk Koo, Hwaseong-si (KR); Byung-Uk Kim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 338 days.

(21) Appl. No.: 11/508,079

(22) Filed: Aug. 22, 2006

(65) Prior Publication Data
US 2007/0048662 A1    Mar. 1, 2007

(30) Foreign Application Priority Data
Aug. 23, 2005    (KR)    ............... 10-2005-0077308

(51) Int. Cl.
G03F 7/00    (2006.01)
G03F 7/004    (2006.01)

(52) U.S. Cl. .............. 430/311; 430/270.1; 430/313; 430/317; 430/318; 430/329; 430/331; 430/905; 430/913; 438/584

(58) Field of Classification Search .................. None
See application file for complete search history.

(56) References Cited

U.S. PATENT DOCUMENTS

| | | | | |
|---|---|---|---|---|
| 5,731,110 A | * | 3/1998 | Hishiro et al. | 430/7 |
| 6,335,276 B1 | * | 1/2002 | Park et al. | 438/648 |
| 6,576,394 B1 | * | 6/2003 | Xu et al. | 430/270.1 |
| 6,762,802 B2 | * | 7/2004 | Ono et al. | 349/38 |
| 6,872,514 B2 | * | 3/2005 | Harada et al. | 430/326 |
| 7,026,091 B2 | * | 4/2006 | Tseng et al. | 430/170 |
| 7,291,439 B2 | * | 11/2007 | Park et al. | 430/191 |
| 7,297,452 B2 | * | 11/2007 | Lee et al. | 430/18 |
| 7,338,737 B2 | * | 3/2008 | Lee et al. | 430/18 |

* cited by examiner

*Primary Examiner*—Amanda C. Walke
(74) *Attorney, Agent, or Firm*—F. Chau & Associates, LLC

(57) ABSTRACT

A photoresist composition includes about 10 to about 70% by weight of a binder resin including a phenol-based polymer, about 0.5 to about 10% by weight of a photo-acid generator, about 1 to about 20% by weight of a cross-linker, about 0.1 to about 5% by weight of a dye and about 10 to about 80% by weight of a solvent. The photoresist composition may be applied to, for example, a method of manufacturing a TFT substrate.

30 Claims, 5 Drawing Sheets

PHOTORESIST COMPOSITION AND METHOD OF MANUFACTURING A THIN-FILM TRANSISTOR SUBSTRATE USING THE SAME

CROSS-REFERENCE TO RELATED APPLICATIONS

This application relies for priority upon Korean Patent Application No. 2005-77308 filed on Aug. 23, 2005, the contents of which are hereby incorporated by reference herein in their entirety.

BACKGROUND OF THE INVENTION

1. Technical Field

The present disclosure relates to a photoresist composition and a method of manufacturing a thin-film transistor substrate using the photoresist composition. More particularly, the present disclosure relates to a photoresist composition capable of forming a halftone photoresist film and a method of manufacturing a thin-film transistor substrate using the photoresist composition.

2. Description of the Related Art

A positive photoresist composition may be used for manufacturing a thin-film transistor (TFT) substrate using four masks. However, when a photoresist film is formed using a positive photoresist composition, the residual uniformity of the photoresist film corresponding to a channel portion may be poor, thereby resulting in a short circuit or a pixel defect. Furthermore, with the above mentioned conventional positive photoresist composition, a semiconductor layer may excessively protrude beneath source-drain electrodes, to decrease the aperture ratio of a display device. Consequently, skew may also be increased when etching processes are performed two or more times.

To overcome the above-mentioned difficulties, a method of manufacturing a TFT, which includes forming a photoresist film having an edge portion with a relatively high pattern angle, by using a negative photoresist composition has been developed. However, conventional negative photoresist compositions have relatively high contrast so that forming a halftone photoresist film by slit exposure may be difficult.

Thus, there is a need for an improved photoresist composition which is capable of forming a halftone photoresist film and to a method of manufacturing a thin-film transistor (TFT) substrate using this improved photoresist composition.

SUMMARY OF THE INVENTION

In accordance with an exemplary embodiment of the present invention, a photoresist composition is provided. The photoresist composition includes about 10 to about 70% by weight of a binder resin including a phenol-based polymer, about 0.5 to about 10% by weight of a photo-acid generator, about 1 to about 20% by weight of a cross-linker, about 0.1 to about 5% by weight of a dye and about 10 to about 80% by weight of a solvent.

The binder resin may include a novolak resin. The dye may include an azo-based dye. A negative photoresist film may be formed using the photoresist composition in a process for manufacturing a TFT substrate.

In accordance with an exemplary embodiment of the present invention, a method of manufacturing a TFT substrate is provided. The method includes forming a first metal layer on a substrate, forming a gate electrode pattern from the first metal layer through a photolithography process, depositing an insulating layer, a semiconductor layer, a second metal layer and a photoresist film on the gate electrode pattern, disposing a mask on the photoresist film and exposing the photoresist film to a light. The mask includes a slit exposure portion. The method further includes developing the photoresist film to expose the second metal layer, etching the exposed second metal layer and the semiconductor layer, firstly stripping a remaining photoresist film to expose a portion of a remaining second metal layer, etching the exposed portion of the remaining second metal layer to expose a portion of a remaining semiconductor layer and to form a source electrode and a drain electrode, etching a portion of the remaining semiconductor layer, which is exposed between the source electrode and the drain electrode and secondly stripping the remaining photoresist film to completely remove the remaining photoresist film.

Therefore, a halftone photoresist film may be stably formed through a slit exposure process using the photoresist composition. Thus, a negative photoresist film may be efficiently applied to a method of manufacturing a TFT substrate using four masks.

Accordingly, with the methods of manufacturing a TFT substrate in accordance with exemplary embodiments of the present, a TFT substrate manufacturing process is provided in which a TFT substrate may be stably formed, and which also has the benefits associated with using a negative photoresist film.

BRIEF DESCRIPTION OF THE DRAWINGS

Exemplary embodiments of the present invention can be understood in more detail from the following detailed description taken in conjunction with the accompanying drawings wherein.

DETAILED DESCRIPTION OF THE EXEMPLARY EMBODIMENTS

Figure 1:
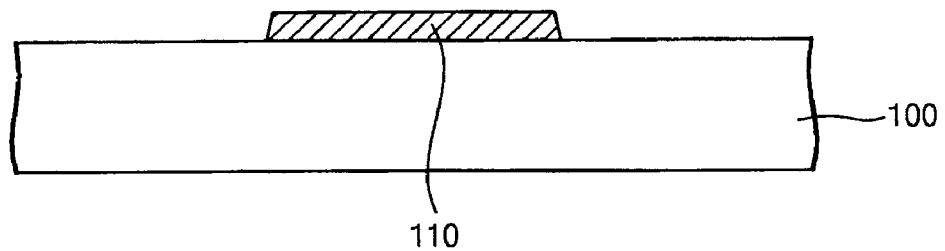
FIGS. 1 to 9 are cross-sectional views illustrating a method of manufacturing a thin-film transistor (TFT) substrate according to an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein.

Photoresist Composition

A photosensitive resin composition includes a binder resin, a photo-acid generator, a cross-linker, a dye and a solvent.

The binder resin may include a hydroxyl aromatic polymer that is soluble in an alkaline solution, such as, for example, an alkaline developing solution, and is not soluble in water.

The binder resin may include a phenol-based polymer. The binder resin may be synthesized by polymerizing aldehyde-based compound and phenol-based compound. Examples of the phenol-based compound include but are not limited ortho-cresol, meta-cresol, 2,4-xylenol, 2,5-xylenol, 3,4-xylenol, novolak derived therefrom, or mixtures thereof. Examples of the binder resin include but are not limited to poly(vinylphenol) such as poly(para-hydroxystyrene), poly(para-hydroxy-α-methylstyrene), a copolymer polymerized from para-hydroxystyrene, para-hydroxy-α-methylstyrene, acetoxystyrene, acrylic acid, methacrylic acid, hydroxyphenyl carbonyl copolymer, or novolak/poly(vinylphenol) copolymer. For example, the binder resin may include a novolak resin containing a repeating unit represented by the following chemical formula (1):

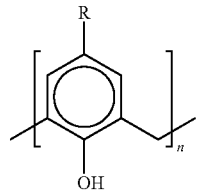

wherein R represents an alkyl group having 1 to 5 carbon atoms.

A polyhydroxystyrene-reduced weight-average molecular weight of the novolak resin may be about 3,000 to about 20,000. For example, the polyhydroxystyrene-reduced weight-average molecular weight of the novolak resin may be about 4,000 to about 12,000.

The content of the binder resin is about 10 to about 70% by weight based on a total weight of the photoresist composition.

The photo-acid generator absorbs light in an exposure process to generate an acid. The acid serves as a catalyst in a cross-linking reaction caused by the cross-linker.

Examples of the photo-acid generator include but are not limited to diazonium salt, iodonium salt, sulfonium salt, diazosulfonyl compound, sulfonyloxyimide, nitrobenzyl sulfonate ester, diphenyliodonium trifluoromethane sulfonate, diphenyliodonium nonafluorobutane sulfonate, triphenylsulfonium trifluoromethane sulfonate, triazine, oxazole, oxadiazole, tiazole, phenol-based sulfonic acid ester, bis-sulfonylmethane, bis-sulfonyldiazomethane, triphenylsulfonium tris(trifluoromethylsulfonyl)methide, diphenyliodonium bis(trifluoromethylsulfonyl)imide, a homologous series thereof and mixtures thereof.

The content of the photo-acid generator is about 0.5 to about 10% by weight based on the total weight of the photoresist composition.

The cross-linker includes an oligomer that generates a carbonium salt in the presence of the acid generated by the photo-acid generator, to cross-link the binder resin. The binder resin in an exposure area is not soluble in an alkaline solution due to the cross-linker so that a pattern of a photoresist film is formed.

The cross-linker includes an amine compound and an aminoplast, such as, for example, urea, melamine, or glycol urea. Examples of the cross-linker include but are not limited to urea-formaldehyde oligomer, melamine-formaldehyde oligomer, benzoguanamine-formaldehyde oligomer, glycoluril-formaldehyde oligomer, or hexa(methoxymethyl)melamine oligomer. For example, a hexa(methoxymethyl)melamine oligomer may be used as the cross-linker.

The content of the cross-linker is about 1 to about 20% by weight based on the total weight of the photoresist composition.

The dye is used for adjusting the contrast of a negative photoresist film. As the negative photoresist film has relatively high contrast, a halftone photoresist film may not be formed. However, when a photoresist composition includes a dye, the dye absorbs light energy properly so that the photoresist composition having the dye stably forms a halftone photoresist film. Thus, a four-mask process to which a negative photoresist film is applied may be performed.

Examples of the dye include but are not limited to an azo-based dye, a triphenylmethane-based dye, an anthraquinone-based dye, an anthrapyridone-based dye, a benzylidene-based dye, an oxonol-based dye, a cyanine-based dye, a phenothiazine-based dye, a pyrolpyrazol azomethin-based dye, a xanthene-based dye, a phthalocyanine-based dye, a benzopyran-based dye, an indigo-based dye, or mixtures thereof.

For example, the azo-based dye may include a pyrazolazo-based compound, an anilinoazo-based compound, an arylazo-based compound, or a pyridonazo-based compound. Furthermore, the azo-based dye includes, for example, a dye compound represented by the following chemical formula (2):

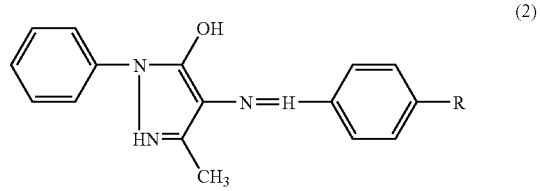

wherein R represents a halogen atom, an alkyl group having 1 to 5 carbon atoms, a cyclohexyl group, a bicyclohexyl group, a phenyl group, a biphenyl group, an alkylene group having 1 to 5 carbon atoms. The cyclohexyl group, the bicyclohexyl group, the phenyl group and the biphenyl group may each include an alcoxy group substituent. The alkylene group may include an alcoxy group having 1 to 5 carbon atoms, a nitrile halogen, a hydroxyl group, a hydrogen atom, as a substituent. Furthermore, the alkylene group may include a phenyl group substituent including an alkyl group having 1 to 5 carbon atoms, a nitrile group, a halogen atom, or a hydrogen atom as a substituent.

The content of the dye is about 0.1 to about 5% by weight based on the total weight of the photoresist composition. For example, the content of the dye may be about 0.5 to about 3% by weight based on the total weight of the photbresist composition. Within the above dye content range, forming a halftone photoresist film is relatively easy, and an excessive amount of exposure light is not needed.

Examples of the solvent include but are not limited to alcohols such as methanol and ethanol, ethers such as tetrahydrofurane, glycol ethers such as ethylene glycol monomethyl ether and ethylene glycol monoethyl ether, ethylene glycol alkyl ether acetates such as methyl cellosolve acetate and ethyl cellosolve acetate, diethylene glycols such as diethylene glycol monomethyl ether, diethylene glycol monoethyl ether and diethylene glycol dimethyl ether, propylene glycol monoalkyl ethers such as propylene glycol methyl ether, propylene glycol ethyl ether, propylene glycol propyl ether and propylene glycol butyl ether, propylene glycol alkyl ether acetates such as propylene glycol methyl ether acetate, propylene glycol ethyl ether acetate, propylene glycol propyl ether acetate and propylene glycol butyl ether acetate, propylene glycol alkyl ether propionates such as propylene glycol methyl ether propionate, propylene glycol ethyl ether propionate, propylene glycol propyl ether propionate and propylene glycol butyl ether propionate, aromatic compounds such as toluene and xylene, ketones such as methyl ethyl ketone, cyclohexanone and 4-hydroxy 4-methyl 2-pentanone, and ester compounds such as methyl acetate, ethyl acetate, propyl acetate, butyl acetate, ethyl 2-hydroxypropionate, methyl 2-hydroxy 2-methyl propionate, ethyl 2-hydroxy 2-methyl propionate, methyl hydroxyacetate, ethyl hydroxyacetate, butyl hydroxyacetate, methyl lactate, ethyl lactate, propyl lactate sulfate, butyl lactate, methyl 3-hydroxypropionate, ethyl 3-hydroxypropionate, propyl 3-hydroxypropionate, butyl 3-hydroxypropionate, methyl 2-hydroxy 3-methyl butanoate, methyl methoxy acetate, ethyl methoxy acetate, propyl methoxy acetate, b.utyl methoxy acetate, methyl ethoxy acetate, ethyl ethoxy acetate, propyl ethoxy acetate, butyl ethoxy acetate, methyl propoxy acetate, ethyl propoxy acetate, propyl propoxy acetate, butyl propoxy acetate, methyl butoxy acetate, ethyl butoxy acetate, propyl butoxy acetate, butyl butoxy acetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, propyl 2-ethoxypropionate, butyl 2- ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, or butyl 3-butoxypropionate.

For example, glycol ethers, ethylene glycol alkyl ether acetates and diethylene glycols may be used based on such factors as solubility, the reactivity of the components of the photoresist composition and the manufacturing condition of the coating layer.

The content of the solvent is about 10 to about 80% by weight based on the total weight of the photoresist composition.

The photoresist composition may further include, for example, an adhesion increaser, a surfactant, a photosensitive agent and/or a T-top-forming suppressant.

The photosensitive agent may transfer energy of a first light to a second light of a wavelength different from the first light within a predetermined wavelength range. The T-top-forming suppressant may suppress T-top formed at a surface of a pattern. The T-top-forming suppressant includes a basic material. Examples of the T-top-forming suppressant include tetrabutylammonium hydroxide, triethanol amine, diethanol amine, trioctyl amine, n-octyl amine, trimethylsulfonium hydroxide, triphenylsulfonium hydroxide and mixtures thereof.

The photoresist composition is coated on a substrate through a coating method such as, for example, a spray method, a roll-coating method, or a spin-coating method to form a coating layer through a pre-bake process.

Although the photoresist composition is for forming a negative photoresist film, the photoresist composition may stably form a halftone photoresist film. Furthermore, the photoresist composition is beneficial with respect to heat resistance and developing characteristics, and is capable of forming a photoresist film having a taper angle no less than about 90° so that consumption of a photoresist film due to a number of etching processes is minimized. Thus, the protrusion of a semiconductor layer formed under a source-drain metal layer may be minimized.

The photoresist compositions of exemplary embodiments of the present invention are described more fully hereinafter with reference to the following examples. However, exemplary embodiments of the present invention are not be limited to these examples.

EXAMPLE 1

About 400 g of propylene glycol methyl ether propionate as a solvent, about 100 g of meta-cresol/formaldehyde novolak resin, of which molecular weight is about 6,000 [weight-average molecular weight (Mw)/number-average molecular weight (Mn)=1.69] as a novolak resin, about 10 g of hexamethylolmelamine hexamethyl ether as a cross-linker, about 3.0 g of diphenyliodonium trifluoromethane sulfonate as a photo-acid generator, about 0.6 g of UV yellow 1549 as an azo-based dye and about 1.0 g of trioctylamine as an amine additive were mixed to prepare a photoresist composition.

EXAMPLE 2

About 400 g of propylene glycol methyl ether propionate as a solvent, about 100 g of meta-cresol/formaldehyde novolak resin, of which molecular weight is about 7,000 [weight-average molecular weight (Mw)/number-average molecular weight (Mn)=1.71] as a novolak resin, about 8.0 g of hexamethylolmelamine hexamethyl ether as a cross-linker, about 4.0 g of triazine as a photo-acid generator, about 1.0 g of UV yellow 1549 as an azo-based dye and about 1.0 g of trioctylamine as an amine additive were mixed to prepare a photoresist composition.

EXAMPLE 3

About 400 g of propylene glycol methyl ether propionate as a solvent, about 100 g of meta-cresol/formaldehyde novolak resin, of which molecular weight is about 8,000 [weight-average molecular weight (Mw)/number-average molecular weight (Mn)=1.74] as a novolak resin, about 12 g of hexamethylolmelamine hexamethyl ether as a cross-linker, about 5.0 g of triazine as a photo-acid generator, about 1.5 g of UV yellow 1549 as an azo-based dye and about 1.0 g of trioctylamine as an amine additive were mixed to prepare a photoresist composition.

EXAMPLE 4

About 400 g of propylene glycol methyl ether propionate as a solvent, about 100 g of meta-cresol/formaldehyde novolak resin, of which molecular weight is about 9,000 [weight-average molecular weight (Mw)/number-average molecular weight (Mn)=1.83] as a novolak resin, about 10 g of hexamethylolmelamine hexamethyl ether as a cross-linker, about 4.0 g of triazine as a photo-acid generator, about 2.0 g of UV yellow 1549 as an azo-based dye and about 1.0 g of trioctylamine as an amine additive were mixed to prepare a photoresist composition.

COMPARATIVE EXAMPLE

About 400 g of propylene glycol methyl ether propionate as a solvent, about 100 g of meta-cresol/formaldehyde novolak resin, of which molecular weight is about 6,000 [weight-average molecular weight (Mw)/number-average molecular weight (Mn)=1.69] as a novolak resin, about 10 g of hexamethylolmelamine hexamethyl ether as a cross-linker, about 3.0 g of diphenyliodonium trifluoromethane sulfonate as a photo-acid generator and about 1.0 g of trioctylamine as an amine additive were mixed to prepare a photoresist composition.

The photoresist compositions of Examples 1 to 4 and Comparative Example were coated and dried to form photoresist films. A sensitivity, a developing speed, a thermal flow temperature, the contrast and angles of an edge portion and a central portion, of each of the photoresist films were measured. The angles of the edge portion and the central portion were measured after developing. The results obtained are illustrated in Table 1.

TABLE 1

|  | Example 1 | Example 2 | Example 3 | Example 4 | Comparative Example |
|---|---|---|---|---|---|
| Sensitivity (mj/cm$^2$) | 20 | 22 | 15 | 12 | 15 |
| Developing Speed (sec) | 30 | 25 | 23 | 21 | 20 |
| Thermal Flow Temperature (° C.) | 130 | 135 | 140 | 145 | 130 |
| Contrast (λ) | 1.5 | 1.2 | 0.8 | 0.57 | 5.0 |
| Angle of Edge Portion (°) | 88 | 95 | 105 | 110 | 88 |
| Angle of Central Portion (°) | 55 | 60 | 63 | 67 | 55 |

Referring to table 1, it is noted that the photoresist films of Examples 1 to 4 have relatively high sensitivity and resolution, and relatively low contrast in comparison with the photoresist film of the Comparative Example. Furthermore, it is noted that the angles of the central portions of Examples 1 to 4 are no less than about 55° when a halftone is formed by a slit exposure. Also, the angles of the edge portions of Examples 1 to 4 are maintained relatively large. The photoresist films of Examples 1 to 4 have relatively improved developing characteristics so that a residue does not remain after developing.

A method of manufacturing a thin-film transistor (TFT) substrate according to an exemplary embodiment of the present invention is described more fully hereinafter with reference to the accompanying drawings.

Method of Manufacturing a TFT Substrate

FIG. 1 is a cross-sectional view illustrating a gate electrode pattern formed on a substrate.

Referring to FIG. 1, a first metal layer for a gate electrode pattern 110 is formed on a substrate 100. The first metal layer may include a single metal layer or two metal layers having metals different from each other. The first metal layer may include, for example, a conducting metal such as molybdenum, chrome, copper, or an alloy thereof.

The first metal layer formed on the substrate 100 is patterned through a photolithography process to form the gate electrode pattern 110.

Figure 2:
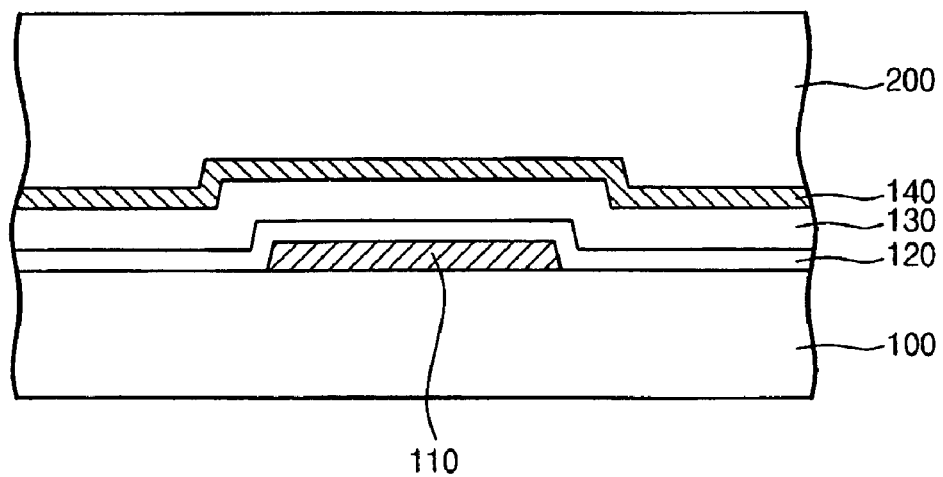

FIG. 2 is a cross-sectional view illustrating an insulating layer, a semiconductor layer, a second metal layer and a photoresist film sequentially formed on the gate electrode pattern illustrated in FIG. 1.

Referring to FIG. 2, an insulating layer 120 is formed on the gate electrode pattern 110. The insulating layer 110 may include, for example, silicon nitride (SiNx). A semiconductor layer 130 is formed on the insulating layer 120. The semiconductor layer 130 may include a first semiconductor layer and a second semiconductor layer formed on the first semiconductor layer. The first semiconductor layer may include, for example, amorphous silicon. A surface of the first semiconductor layer may be highly ion-doped to form the second semiconductor layer. The second semiconductor layer may include, for example, n$^+$ amorphous silicon. The second metal layer 140 is formed on the semiconductor layer 130.

The second metal layer 140 may include, for example, a conducting metal such as molybdenum, chrome, copper, or an alloy thereof. A photoresist film 200 is formed on the second metal layer 140.

A photoresist composition is coated on the second metal layer 140 and is pre-baked at a temperature of about 70 to about 110° C. for about 1 to about 15 minutes to form the photoresist film 200.

The photoresist composition is a negative photoresist composition. Thus, an exposed portion of the photoresist film is developed by a developing solution.

The photoresist composition includes about 10 to about 70% by weight of a binder resin including a phenol-based polymer, about 0.5 to about 10% by weight of a photo-acid generator, about 1 to about 20% by weight of a cross-linker, about 0.1 to about 5% by weight of an azo-based dye and about 10 to about 80% by weight of a solvent.

The azo-based dye absorbs light energy during a slit exposure to reduce the contrast of a photoresist film so that a halftone photoresist film is stably formed. For example, the azo-based dye may include an azo-based compound represented by the following chemical formula (2):

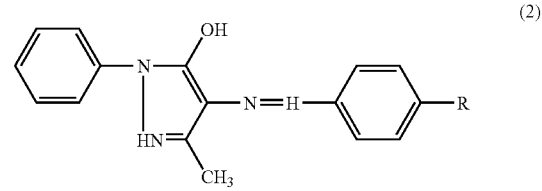

(2)

wherein R represents a halogen atom, an alkyl group having 1 to 5 carbon atoms, a cyclohexyl group, a bicyclohexyl group, a phenyl group, a biphenyl group, an alkylene group having 1 to 5 carbon atoms. The cyclohexyl group, the bicyclohexyl group, the phenyl group and the biphenyl group may each include an alcoxy group substituent. The alkylene group may include an alcoxy group having 1 to 5 carbon atoms, a nitrile halogen, a hydroxyl group, or a hydrogen atom as a substituent. Furthermore, the alkylene group may include a phenyl group substituent including an alkyl group having 1 to 5 carbon atoms, a nitrile group, a halogen atom, or a hydrogen atom as a substituent.

Figure 3:
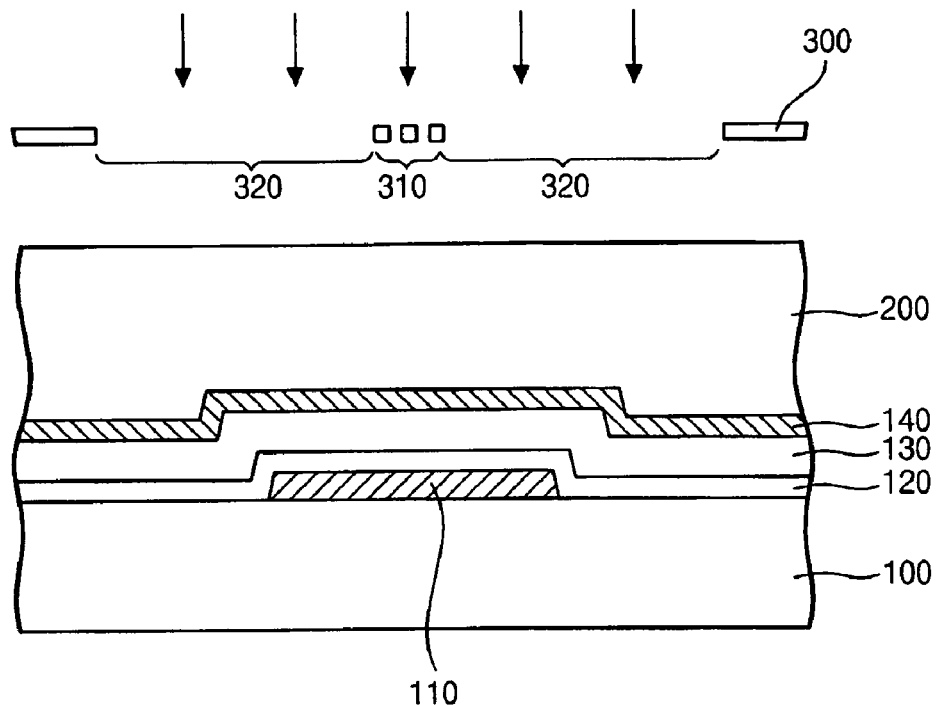
Figure 4:
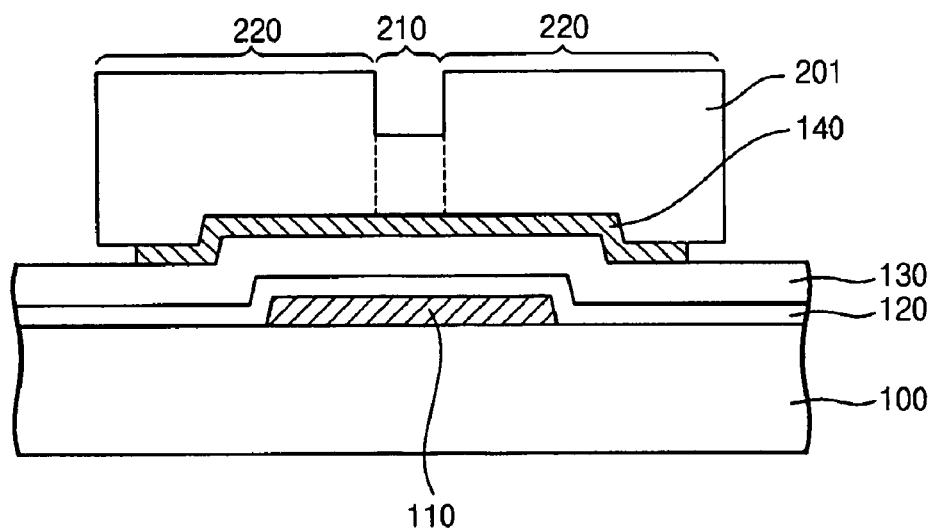

FIG. 3 is a cross-sectional view illustrating a process that disposes a mask on the photoresist film illustrated in FIG. 2 and exposes the photoresist film to a light. FIG. 4 is a cross-sectional view illustrating the second metal layer etched after an exposure process and a developing process.

Referring to FIG. 3, a mask 300 include a slit exposure portion 310 that has a plurality of slits and is formed at a central portion of the mask 300, which corresponds to the gate electrode pattern 110. The mask 300 further includes openings 320 adjacent to the slit exposure portion 310. The openings correspond to source-drain electrodes, respectively.

Referring to FIG. 4, a non-exposed portion of the photoresist film 200 is removed by a developing solution. The remaining photoresist film 201 includes a first area 210 corresponding to the slit exposure portion 310 and a second area 220 corresponding to the opening 320. The photoresist film of the first area 210 is exposed to a light through a slit to form a halftone photoresist film. Thus, a portion of the photoresist film 200 is removed through the developing process. After the portion of the photoresist film 200 is removed, the remaining photoresist film of the first area 210 has a flat surface.

An edge portion of the remaining photoresist film 201 has a taper angle of no less than about 90°. The photoresist film of the first area 210 has a height smaller than a height of the photoresist film of the second area 220. For example, the photoresist film of the first area 210 may have a height of about 40 to about 60% of the height of the photoresist film of the second area 220.

Figure 5:
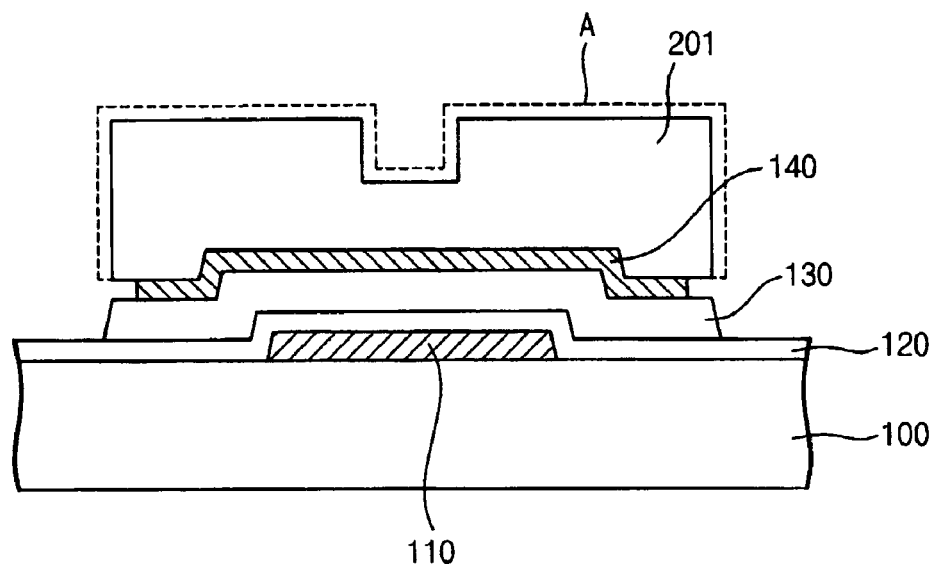

The second metal layer 140 under the completely removed photoresist film is etched using the remaining photoresist film 201 as a mask. FIG. 5 is a cross-sectional view illustrating the semiconductor layer exposed by etching the second metal layer.

Referring to FIG. 5, the second metal layer 140 is etched to expose the semiconductor layer 130. The exposed semiconductor layer 130 is completely etched by, for example, an etching solution. A portion 'A' of the remaining photoresist film 201 is lost while the semiconductor layer 130 is etched. However, the photoresist film is a negative photoresist film and has a relatively large taper angle. Thus, the lost amount of the photoresist film 201 is relatively small in comparison with a positive photoresist film.

Figure 6:
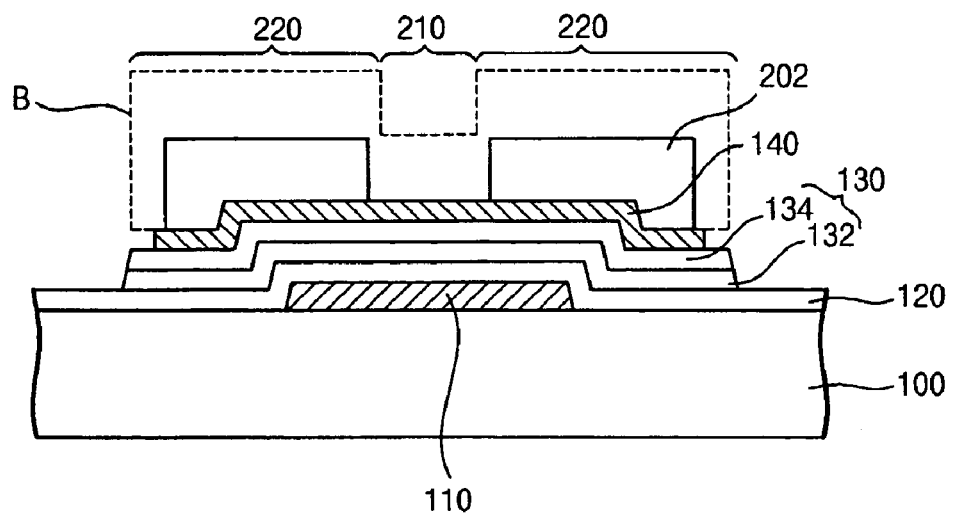

FIG. 6 is a cross-sectional view illustrating the remaining photoresist film firstly stripped.

Referring to FIG. 6, the remaining photoresist film 201 is firstly stripped through, for example, an ashing process using oxygen plasma. When the remaining photoresist film 201 is ashed, the photoresist film of the first area 210 is removed. The height of the photoresist film 202 of the second area 220 becomes substantially the same as a height of the removed photoresist film of the first area 220. Furthermore, a portion 'B' of a peripheral portion of the remaining photoresist film 202 of the second area 220 is lost. However, the lost amount of the photoresist film 201 is relatively small in comparison with the lost amount of a positive photoresist film.

The photoresist film 201 of the first area 210 is removed to expose the second metal layer 140 corresponding to the first area 210.

The semiconductor layer 130 includes a first semiconductor layer 132 including, for example, amorphous silicon and a second semiconductor layer 134 including, for example, n$^+$ amorphous silicon.

Figure 7:
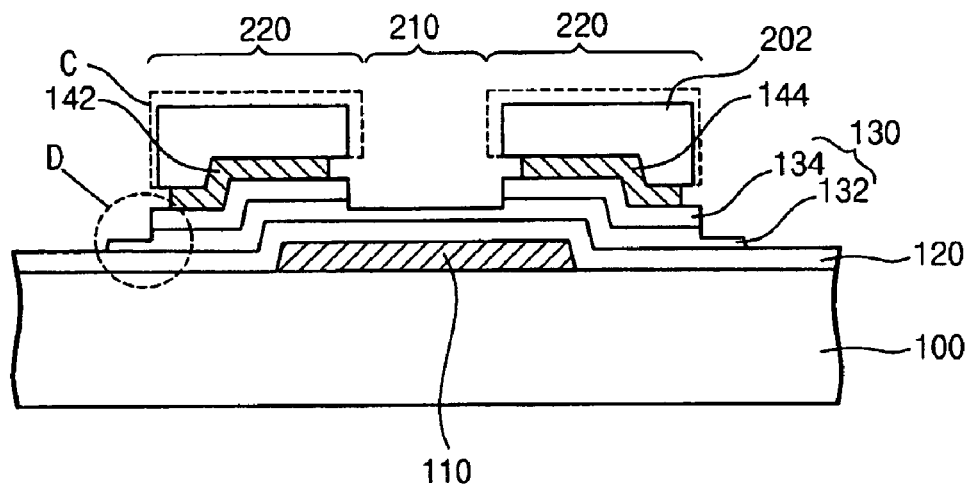

FIG. 7 is a cross-sectional view illustrating the second metal layer corresponding to the first area and the semiconductor layer of which a portion is etched.

Referring to FIG. 7, the second metal layer 140 exposed by removing the photoresist film 201 of the first area 210 is etched, for example, by an etchant to form a source electrode 142 and a drain electrode 144 on the semiconductor layer 130. When the second metal layer 140 between the source electrode 142 and the drain electrode 144 is etched, the second semiconductor layer 134 corresponding to the first area 210 is exposed. The exposed second semiconductor layer 134 is etched by, for example, an etchant. In this process, a portion of the first semiconductor layer 132 may be etched. A portion 'C' of the remaining photoresist film 202 is lost while the second metal layer 140 and the second semiconductor layer 134 are etched.

Figure 8:
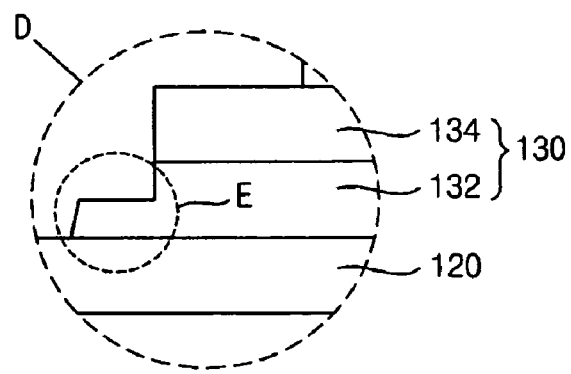

FIG. 8 is a partially enlarged view illustrating the portion 'D' illustrated in FIG. 7.

Referring to FIG. 8, when a portion of the second semiconductor layer 134 and a portion of the first semiconductor layer 132 are etched, the first semiconductor layer 132 includes a protrusion 'E' protruding in a lateral direction. As the lost amount of the remaining photoresist film 202 is relatively small in an etching process, the protruding length of the protrusion 'E' the first semiconductor layer 132 is relatively small in comparison to when a positive photoresist film is used. Thus, the aperture ratio of a pixel is prevented from decreasing.

Figure 9:
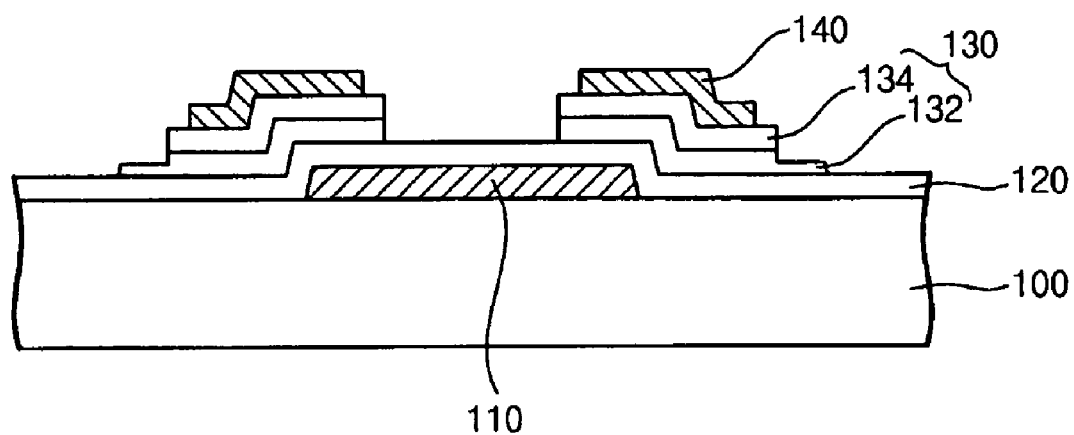

FIG. 9 is a cross-sectional view illustrating the substrate wherein the remaining photoresist film is completely removed.

Referring to FIG. 9 the remaining photoresist film 202 is completely removed through an ashing process using oxygen plasma. The semiconductor layer 130 is hardly etched, as the etching selectivity of the semiconductor layer 130 is large with respect to the oxygen plasma.

Thus, the TFT substrate is completely formed.

Furthermore, a protecting layer may be formed on the substrate 100 to cover the source electrode 142 and the drain electrode 144. Also, a contact hole may be formed at the protecting layer corresponding to the drain electrode 144 through an exposure process and a developing process.

A third metal layer may be formed on the protecting layer. The third metal layer may serve as a pixel electrode in the TFT substrate and be electrically connected to the drain electrode via the contact hole. As the method of manufacturing a TFT substrate according to an exemplary embodiment of the present invention forms a negative photoresist film using a negative photoresist composition including a dye, the method of manufacturing a TFT substrate may stably form a TFT substrate while also having the benefits associated with using negative photoresist films.

Moreover, a negative photoresist film formed using the photoresist composition of the exemplary embodiments of the present invention has a relatively large taper angle so that the lost amount of the negative photoresist film in an etching process is relatively small in comparison with a positive photoresist film. Thus, the protruding length of a semiconductor layer is reduced so that the aperture ratio of a pixel is prevented from decreasing.

Furthermore, the photoresist composition of the exemplary embodiments of the present invention reduces the contrast of a negative photoresist film to stably form a halftone photoresist film. Also, a four-mask process using the photoresist composition may stably form a TFT substrate.

Furthermore, a photoresist composition in accordance with exemplary embodiments of the present invention is also beneficial with respect to heat resistance and developing characteristics.

The method of manufacturing a TFT substrate of exemplary embodiments of the present invention also increases the residual uniformity of a photoresist film between a source electrode and a drain electrode to prevent a short circuit and a pixel defect.

Having described the exemplary embodiments of the present invention, it is further noted that it is readily apparent to those of reasonable skill in the art that various modifications may be made without departing from the spirit and scope of the invention which is defined by metes and bounds of the appended claims.

What is claimed is:

1. A method of manufacturing a thin-film transistor (TFT) substrate, which comprises:
   forming a first metal layer on a substrate and forming a gate electrode pattern from the first metal layer through a photolithography process;
   depositing an insulating layer, a semiconductor layer, a second metal layer and a photoresist film on the gate electrode pattern;
   disposing a mask having a slit exposure portion on the photoresist film and exposing the photoresist film to a light;

developing the photoresist film to expose the second metal layer and etching the exposed second metal layer and the semiconductor layer, and wherein the developing of the photoresist film removes a non-exposed portion of the photoresist film and forms a remaining photoresist film having an edge portion with a taper angle more than or substantially equal to 90°;

firstly stripping a portion of the remaining photoresist film to expose a portion of a remaining second metal layer;

etching an exposed portion of the remaining second metal layer to expose a portion of a remaining semiconductor layer and to form a source electrode and a drain electrode;

etching a portion of the remaining semiconductor layer exposed between the source electrode and the drain electrode; and secondly stripping the remaining photoresist film to completely remove the remaining photoresist film.

2. The method of manufacturing a TFT substrate of claim 1, further comprising forming a protecting layer to cover the source electrode and the drain electrode.

3. The method of manufacturing a TFT substrate of claim 2, further comprising exposing a portion of the protecting layer to a light and developing the protecting layer to expose a portion of the drain electrode.

4. The method of manufacturing a TFT substrate of claim 2, further comprising forming a third metal layer on the protecting layer and patterning the third metal layer.

5. The method of manufacturing a TFT substrate of claim 1, wherein the first metal layer comprises two metal layers having metals different from each other, respectively.

6. The method of manufacturing a TFT substrate of claim 1, wherein the semiconductor layer comprises a first semiconductor layer having amorphous silicon and a second semiconductor layer that is formed on the first semiconductor layer and has $n^+$ amorphous silicon.

7. The method of manufacturing a TFT substrate of claim 6, wherein the second semiconductor layer of the remaining semiconductor layer exposed between the source electrode and the drain electrode is removed to expose the first semiconductor layer.

8. The method of manufacturing a TFT substrate of claim 1, wherein the photoresist film is formed by coating a photoresist composition on the second metal layer and pre-baking the photoresist composition at a temperature of about 70 to about 110° C. for about 1 to about 15 minutes.

9. The method of manufacturing a TFT substrate of claim 8, wherein the photoresist composition is a negative photoresist composition.

10. The method of manufacturing a TFT substrate of claim 8, wherein the photoresist composition comprises:
    about 10 to about 70% by weight of a novolak resin;
    about 0.5 to about 10% by weight of a photo-acid generator;
    about 1 to about 20% by weight of a cross-linker;
    about 0.1 to about 5% by weight of a dye; and
    about 10 to about 80% by weight of a solvent.

11. The method of manufacturing a TFT substrate of claim 10, wherein the dye comprises an azo-based dye, and the azo-based dye comprises a compound represented by chemical formula (2):

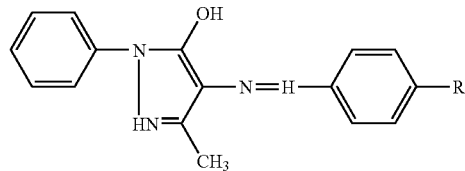

wherein R represents one selected from the group consisting of a halogen atom; an alkyl group having 1 to 5 carbon atoms; a cyclohexyl group, a bicyclohexyl group, a phenyl group, a biphenyl group and an alkylene group having 1 to 5 carbon atoms, wherein the cyclohexyl group, the bicyclohexyl group, the phenyl group, and the biphenyl group each comprise an alcoxy group substituent, wherein the alkylene group having 1 to 5 carbon atoms comprises at least one substituent selected from the group consisting of an alcoxy group having 1 to 5 carbon atoms, a nitrile halogen, a hydroxyl group and a hydrogen atom and a phenyl group sub stituent comprising one selected from the group consisting of an alkyl group having 1 to 5 carbon atoms, a nitrile group, a halogen atom and a hydrogen atom.

12. The method of claim 10, wherein the dye comprises at least one selected from the group consisting of an azo-based dye, a triphenylmethane-based dye, an anthraquinone-based dye, an anthrapyridone-based dye, a benzylidene-based dye, an oxonol-based dye, a cyanine-based dye, a phenothiazine-based dye, a pyrolpyrazol azomethin-based dye, a xanthene-based dye, a phthalocyanine-based dye, a benzopyran-based dye and an indigo-based dye.

13. The method of claim 12, wherein the binder resin comprises a novolak resin.

14. The method of claim 13, wherein the novolak resin comprises a repeating unit represented by chemical formula (1):

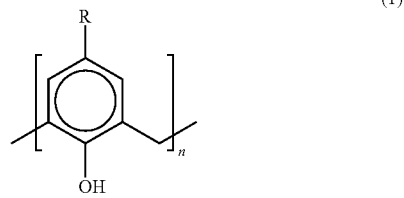

wherein R represents an alkyl group having 1 to 5 carbon atoms.

15. The method of claim 13, wherein a polyhydroxystyrene-converted weight-average molecular weight of the novolak resin is about 3,000 to about 20,000.

16. The method of claim 12, wherein the photo-acid generator generates an acid by being exposed to a light.

17. The method of claim 16, wherein the photo-acid generator comprises at least one selected from the group consisting of diazonium salt, iodonium salt, sulfonium salt, diazosulfonyl compound, sulfonyloxyimide, nitrobenzyl sulfonate ester, diphenyliodonium trifluoromethane sulfonate, diphenyliodonium nonafluorobutane sulfonate, triphenylsulfonium trifluoromethane sulfonate, triazine, oxazole, oxadiazole, tiazole, phenol-based sulfonic acid ester, bis-sulfonylmethane, bis-sulfonyldiazomethane, triphenylsulfonium tris(trifluoromethylsulfonyl)methide, diphenyliodonium bis(trifluoromethylsulfonyl)imide and a homologous series thereof.

18. The method of claim 12, wherein the cross-linker comprises at least one selected from the group consisting of a urea-based compound, a melamine-based compound and a glycol urea compound.

19. The method of claim 12, wherein the cross-linker comprises a hexa(methoxymethyl)melamine oligomer.

20. The method of claim 12, wherein the azo-based dye comprises at least one selected from the group consisting of a pyrazolazo-based compound, an anilinoazo-based compound, an arylazo-based compound and a pyridonazo-based compound.

21. The method of claim 12, further comprising at least one additive selected from the group consisting of an adhesion increaser, a surfactant and a T-top-forming suppressant.

22. The method of claim 12, wherein the T-top-forming suppressant comprises at least one selected from the group consisting of tetrabutylammonium hydroxide, triethanol amine, diethanol amine, trioctyl amine, n-octyl amine, trimethylsulfonium hydroxide and triphenylsulfonium hydroxide.

23. The method of manufacturing a TFT substrate of claim 1, wherein the slit exposure portion corresponds to an area between the source electrode and the drain electrode.

24. The method of manufacturing a TFT substrate of claim 23, wherein the mask has openings that are adjacent to the slit exposure portion and correspond to the source electrode and the drain electrode, respectively.

25. The method of manufacturing a TFT substrate of claim 1, wherein a developed photoresist film comprises a first area corresponding to the slit exposure portion and a second area corresponding to the source electrode and the drain electrode.

26. The method of manufacturing a TFT substrate of claim 25, wherein a height of the photoresist film of the first area is smaller than a height of the photoresist film of the second area.

27. The method of manufacturing a TFT substrate of claim 26, wherein the height of the photoresist film of the first area is about 40 to about 60% of the height of the photoresist film of the second area.

28. The method of manufacturing a TFT substrate of claim 27, wherein the photoresist film of the first area has a flat surface.

29. The method of manufacturing a TFT substrate of claim 26, wherein only the photoresist film of the second area remains after the firstly stripping the remaining photoresist film.

30. The method of manufacturing a TFT substrate of claim 1, wherein the first stripping and the second stripping of the remaining photoresist film are performed by ashing processes using oxygen plasma.

* * * * *